United States Patent
Lee et al.

(10) Patent No.: US 10,788,752 B2
(45) Date of Patent: Sep. 29, 2020

(54) STEREO LITHOGRAPHY THREE-DIMENSIONAL PRINTING APPARATUS AND METHOD OF FORMING COLORED THREE-DIMENSIONAL OBJECT

(71) Applicants: XYZPRINTING, INC., New Taipei (TW); KINPO ELECTRONICS, INC., New Taipei (TW)

(72) Inventors: Wei-Hua Lee, New Taipei (TW); Hung-Peng Kang, New Taipei (TW)

(73) Assignees: XYZPRINTING, INC., New Taipei (TW); KINPO ELECTRONICS, INC., New Taipei (TW)

(*) Notice: Subject to any disclaimer, the term of this patent is extended or adjusted under 35 U.S.C. 154(b) by 253 days.

(21) Appl. No.: 15/600,233

(22) Filed: May 19, 2017

(65) Prior Publication Data
US 2018/0239251 A1    Aug. 23, 2018

(30) Foreign Application Priority Data

Feb. 17, 2017  (TW) .............................. 106105176 A (51) Int. Cl.
*G03F 7/095*    (2006.01)
*B33Y 10/00*    (2015.01)
(Continued)

(52) U.S. Cl.
CPC ............ *G03F 7/0952* (2013.01); *B29C 41/10* (2013.01); *B29C 41/22* (2013.01); *B29C 64/124* (2017.08);
(Continued)

(58) Field of Classification Search
CPC ......... B33Y 10/00; B33Y 30/00; B33Y 40/00; B29C 64/124; B29C 64/40; B29C 64/30;
(Continued)

(56) References Cited

U.S. PATENT DOCUMENTS

2006/0022379 A1* 2/2006 Wicker .................. B33Y 30/00
                                                        264/255
2016/0167301 A1* 6/2016 Cole ...................... B33Y 70/00
                                                        425/174.4
(Continued)

FOREIGN PATENT DOCUMENTS

CN         103303000 A     9/2013
CN         106274111 A     1/2017
(Continued)

OTHER PUBLICATIONS

Definition of Emulsion, Merriam-Webster dictionary, retrieved from the internet on Aug. 13, 2019 <URL: https://www.merriam-webster.com/dictionary/emulsion> (Year: 2019).*

(Continued)

*Primary Examiner* — Robert E Fennema
*Assistant Examiner* — Jonathan Michael Skrzycki
(74) *Attorney, Agent, or Firm* — Chun-Ming Shih; HDLS IPR Services (57) ABSTRACT

The three-dimensional printing apparatus includes a tank, a platform, a lighting module, a control unit, a photosensitizer coating unit, and an exposure and development unit. The tank is filled with a liquid forming material, and the platform is movably disposed above the tank. The lighting module is used for providing light projecting toward the liquid forming material. The control unit coupled to the platform and the lighting module is configured to control the platform to move along a first direction, such that at least one layer object of a three-dimensional object is cured on the platform by layer. The photosensitizer coating unit is coupled to the control unit and configured to form at least one photosensitizer film on the layer object. The exposure and development unit is coupled to the control unit and configured to (Continued)

expose the photosensitizer film by exposing and developing to color the three-dimensional object.

12 Claims, 10 Drawing Sheets

(51) Int. Cl.
| | |
|---|---|
| *B29C 64/30* | (2017.01) |
| *B29C 64/40* | (2017.01) |
| *B33Y 40/00* | (2020.01) |
| *B29C 64/124* | (2017.01) |
| *B33Y 30/00* | (2015.01) |
| *B29C 41/10* | (2006.01) |
| *B29C 41/22* | (2006.01) |
| *B29C 64/165* | (2017.01) |
| *B29C 64/20* | (2017.01) |
| *B29C 41/08* | (2006.01) |
| *G05B 19/4099* | (2006.01) |

(52) U.S. Cl.
CPC .............. *B29C 64/30* (2017.08); *B29C 64/40* (2017.08); *B33Y 10/00* (2014.12); *B33Y 30/00* (2014.12); *B33Y 40/00* (2014.12); *B29C 41/08* (2013.01); *B29C 64/165* (2017.08); *B29C 64/20* (2017.08); *G03F 7/095* (2013.01); *G05B 19/4099* (2013.01)

(58) Field of Classification Search
CPC ......... B29C 41/10; B29C 41/22; B29C 64/20; B29C 64/165; B29C 41/08; G03F 7/095; G05B 19/4099
See application file for complete search history.

(56) References Cited

U.S. PATENT DOCUMENTS

| | | | | |
|---|---|---|---|---|
| 2016/0375638 A1* | 12/2016 | Kabili | ................... | B29C 64/386 |
| | | | | 264/492 |
| 2017/0225491 A1* | 8/2017 | Miller | ........................ | B41J 2/21 |
| 2018/0126663 A1* | 5/2018 | Jun | ........................ | B33Y 10/00 |
| 2018/0169998 A1* | 6/2018 | Hirakata | ................. | B32B 27/34 |

FOREIGN PATENT DOCUMENTS

| | | | | | |
|---|---|---|---|---|---|
| GB | | 2419679 | * | 7/2005 | .............. G03C 1/04 |
| JP | | 2005319761 A | | 11/2005 | |
| JP | | 2009519143 A | | 5/2009 | |
| KR | | 100178874 B1 | | 5/1999 | |
| TW | | 201532852 A | | 9/2015 | |
| TW | | M521203 U | | 5/2016 | |
| TW | | 201703988 A | | 2/2017 | |

OTHER PUBLICATIONS

Translation of foreign document JP2005319761. Retrived from the internet on Aug. 13, 2019. <URL: https://patents.google.com/patent/JP2005319761A/en?oq=JP2005319761> (Year: 2004).*

Merriam-Webster, Definition of Blend, obtained from the internet on Apr. 1, 2020 URL<https://www.merriam-webster.com/dictionary/blend> (Year: 2020).*

Office Action dated Jun. 25, 2018 of the corresponding Taiwan patent application.

* cited by examiner

STEREO LITHOGRAPHY THREE-DIMENSIONAL PRINTING APPARATUS AND METHOD OF FORMING COLORED THREE-DIMENSIONAL OBJECT

BACKGROUND

Technical Field

The present disclosure relates to a printing apparatus and a printing method. More particularly, the present disclosure relates to a three-dimensional printing apparatus and method for three-dimensional printing.

Description of Related Art

In general, additive manufacturing technology converts design information of a 3D model built by software such as computer-aided design (CAD) into a plurality of thin (quasi-two-dimensional) cross-sectional layers stacked continuously. At the same time, many technical means capable of forming a plurality of thin cross-sectional layers have also been gradually proposed. For instance, the printing module of a printing apparatus can generally move above the substrate along an XY-plane according to the spatial coordinates XYZ built by the design information of the 3D model, such that the building material can form a correct cross-sectional layer shape. The deposited building material can be subsequently cured in a natural manner, or cured via heating or irradiation from a light source to form the needed cross-sectional layers. Therefore, since the printing module moves along an axis Z layer by layer, a plurality of cross-sectional layers can be stacked layer by layer along the axis Z. As a result, the building material can form a three-dimensional structure when being cured layer by layer.

Using a technique in which a three-dimensional structure is formed by curing a building material with a light source as an example, the printing module is adapted to be immersed in a liquid forming material filled in a tank, and a light source module irradiates the liquid forming material on the XY-plane. As a result, the liquid forming material is cured and stacked on a moving platform of the printing module. Therefore, since the moving platform of the printing module moves along the axis Z layer by layer, the liquid forming material can be cured layer by layer and stacked into a three-dimensional structure.

However, once the additive manufacturing technique is applied to manufacture a colored three-dimensional object, the three-dimensional object must be immersed in liquid forming materials with different colors required by the resultant three-dimensional object. The former limitation apparently complicates the process of forming the colored three-dimensional object and increases the time spent on said process. In order to simplify the process of forming the colored three-dimensional object, some manufacturers color the three-dimensional after it is formed, however, manufacturers may not guarantee that the colored pigment required by forming the three-dimensional object can be fused and mixed with the liquid forming material, and the color of the resultant three-dimensional object may not be as rich as expected. Hence, how to resolve said issues has become one of the major concerns of people having ordinary skill in the art.

SUMMARY

According to one aspect of the present disclosure, a three-dimensional printing apparatus includes a tank, a platform, a lighting module, a control unit, a photosensitizer coating unit, and an exposure and development unit; the tank is filled with a liquid forming material, and the platform is movably disposed above the tank. The lighting module is used for providing light projecting toward the liquid forming material. The control unit is coupled to the platform and the lighting module and configured to control the platform to move along a first axial direction, such that at least one layer object of a three-dimensional object is cured on the platform by layer. The photosensitizer coating unit is electrically connected to the control unit and configured to form at least one photosensitizer film on the layer object. The exposure and development unit is electrically connected to the control unit and configured to expose the photosensitizer film by exposing and developing so as to color the three-dimensional object.

Based on the above, in the disclosure, the exposure and development unit is configured to separately perform exposure and development on the photosensitizer films formed on the layer objects.

In an embodiment of the disclosure, the exposure and development unit configured to perform exposure and development on the photosensitizer films formed on the layer objects after the three-dimensional object is completely formed.

In an embodiment of the disclosure, the platform is directed to remove the layer object from the liquid forming material along the first direction by the control unit after the layer object is solidified.

In an embodiment of the disclosure, further comprising a drying unit electrically connected to the control unit and configured to dry the photosensitizer films.

In an embodiment of the disclosure, each photosensitizer film includes a resin material and a photosensitizer uniformly disposed within the resin material.

In an embodiment of the disclosure, wherein each photosensitizer film includes a resin material and a photosensitizer coated on the resin material.

In an embodiment of the disclosure, the photosensitizer coating unit is a nozzle or a roller.

According to another aspect of the present disclosure, a method for three-dimensional printing, capable of forming a three-dimensional object on a three-dimensional printing apparatus, includes: arranging a lighting module for irradiating the tank; moving the platform for forming a layer object of the three-dimensional object with certain depth; forming at least one photosensitizer film over the layer object; exposing the photosensitizer film to color the layer object; and forming the three-dimensional object by sequentially stacking the layer object and the photosensitizer film.

In an embodiment of the disclosure, the method for three-dimensional printing further includes a step to direct the platform to remove the layer object from the liquid forming material before forming the photosensitizer film.

In an embodiment of the disclosure, the method for three-dimensional printing further includes a step to dry the photosensitizer film before performing exposure and development.

In an embodiment of the disclosure, the photosensitizer film are exposed and developed after the three-dimensional object is formed by sequentially stacking the layer object and the photosensitizer film.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
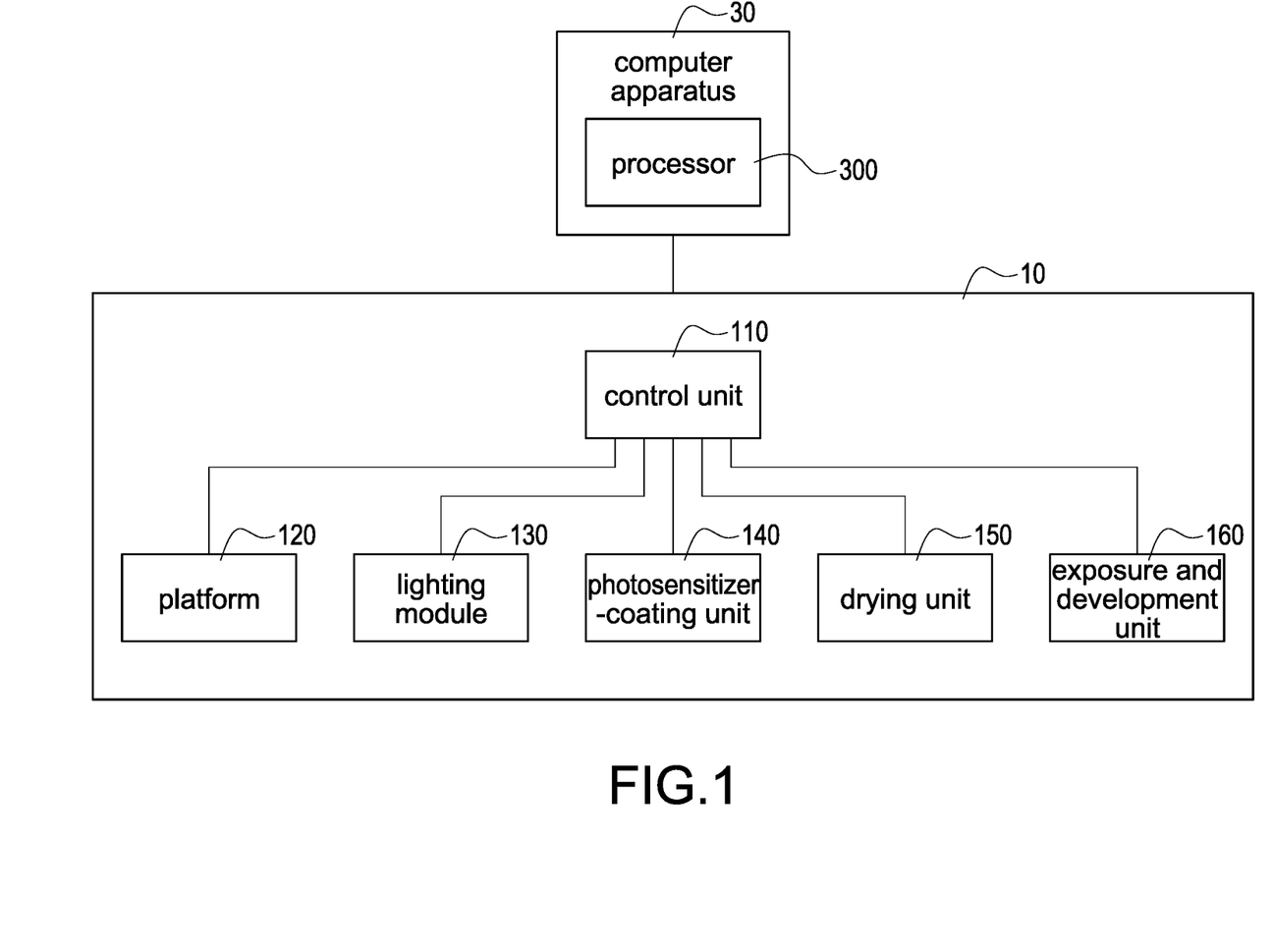
FIG. 1 is a circuit block diagram of a three-dimensional printing apparatus according to a first embodiment of the present disclosure.

Reference is made to FIG. 1, which is a circuit block diagram of a three-dimensional printing apparatus according to a first embodiment of the present disclosure. The three-dimensional printing apparatus 10 is a stereo lithography apparatus (SLA) for forming three-dimensional objects 20 of a three-dimensional model (not shown). In FIG. 1, the three-dimensional printing apparatus 10 includes a control unit 110, a platform 120, a lighting module 130, at least one photosensitizer-coating unit 140, a drying unit 150, and an exposure and development unit 160. The control unit 110 is in electrical communications with a processor 300, used to execute a computing function, of a computer apparatus 30, such as a notebook, a tablet, or a desktop. The processor 300 may edit and process the three-dimensional model of a three-dimensional object 20 into a plurality of cross-sectional information and send the cross-sectional information to the control unit 110 of the three-dimensional printing apparatus 10. The three-dimensional printing apparatus 10 is applied to print the three-dimensional object in accordance with the cross-sectional information. Notably, the three-dimensional model can be a digital three-dimensional image file constructed by a computer via, for instance, a computer-aided design (CAD) or an animation modeling software. The processor 300 may crosscut the three-dimensional model into the cross-sectional information to form a plurality of layer objects; the three-dimensional object 20 is formed by continuously stacking the layer objects.

Figure 2A:
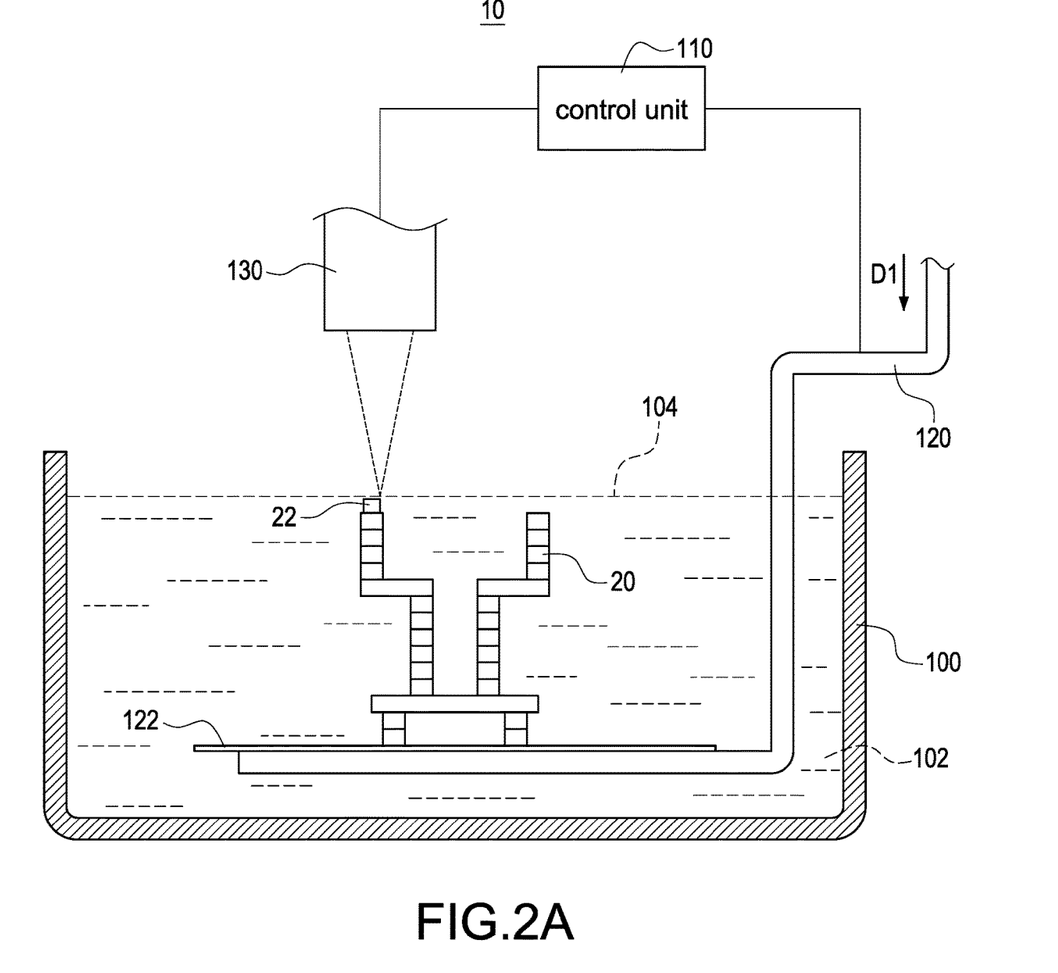
FIG. 2A-FIG. 2E are schematic views illustrating intermediate process steps of a method for fabricating a three-dimensional object according to the first embodiment of the present disclosure.

With referring to FIG. 2A; the platform 120 is disposed above the tank 100 and is adapted to move relative to the tank 100 along a first direction D1. The tank 100 contains a liquid forming material 102; the platform 120 is coupled to and driven by the control unit 110 so as to be vertically movable in a step-wise fashion along a first direction D1 within the tank 100. The liquid forming material 102 is, for example, a photosensitive resin and may sensitive to irradiation with specific wavelength (such as ultraviolet light).

The lighting module 130 is, for example, one of the laser component, the vibration-actuated micro mirror module, the light-projecting module using digital light processing (DLP) technology, and the light emitting diode (LED) string. In this embodiment, the lighting module 130 is movable disposed above the tank 100 and irradiates the liquid forming material 102 for solidifying the liquid forming material 102 to a certain depth from a liquid surface 104 of the liquid forming material 102. It is therefore possible to form a layer object 22 at the liquid surface 104 which has a desired pattern by moving the lighting module 130 across the liquid surface 104 of the liquid forming material 102.

Figure 2B:
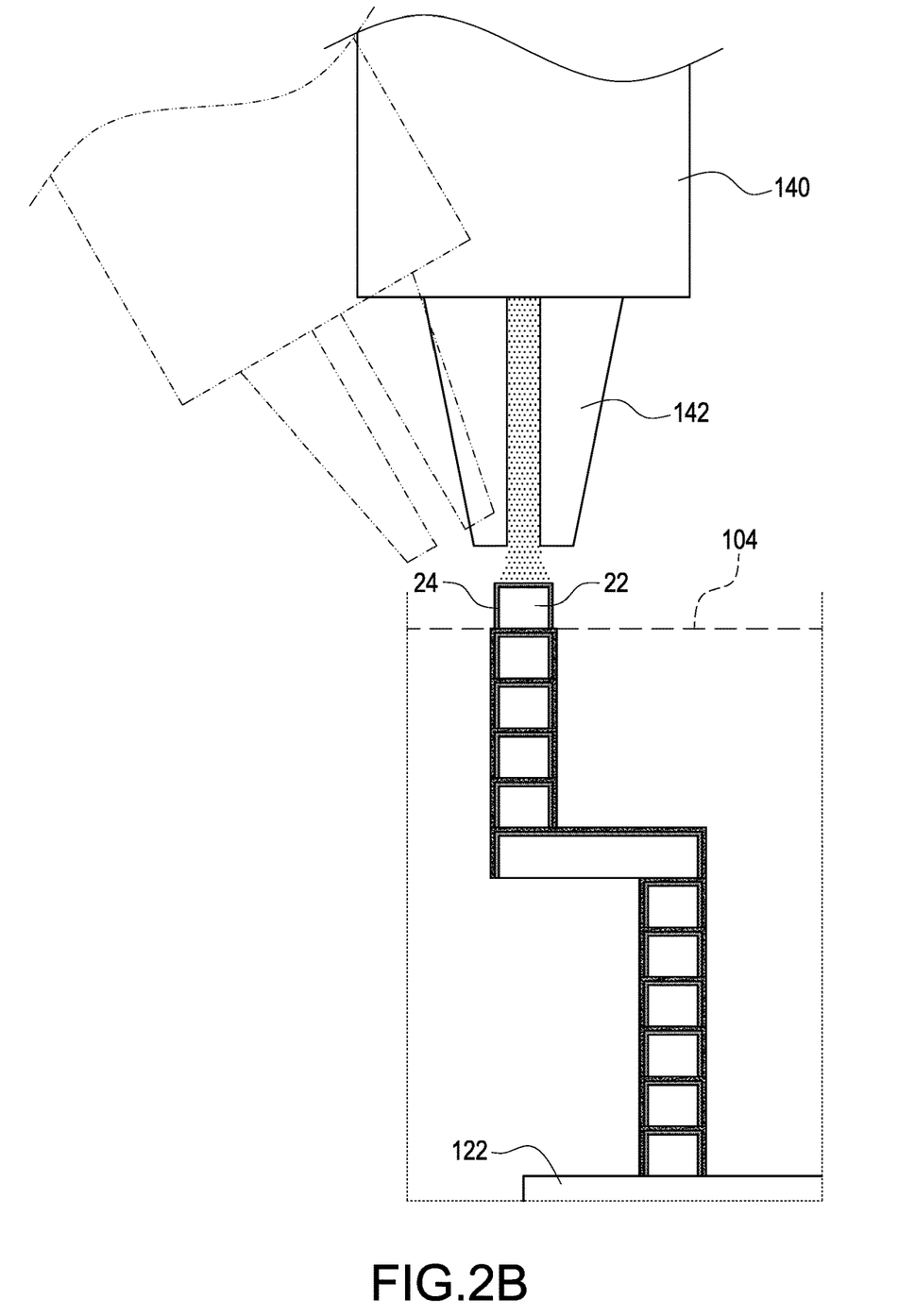

Thereafter, a first photosensitizer film 24 flows over the layer object 22. More particular, when the layer object 22 with desired pattern is formed at the liquid surface 104, the layer object 22 is held on the platform 120 and is lowered into the liquid forming material 102, at which condition, the platform 120 is directed to remove the layer object 22 from the liquid forming material 102. A photosensitizer-coating unit 140 is then moved along the first direction D1 to be above the tank 100, as shown in FIG. 2B. The photosensitizer-coating unit 140 includes an elongated nozzle 142 for supplying a photosensitive resin to the layer object 22 for forming a first photosensitizer-coating film 24 of a substantially constant thickness on the outer surface of the layer object 22. The photosensitive resin is an emulsion, which is included of a blend of a resin (such as gelatins) and a photosensitizer (such as silver halides). After the photosensitizer is exposed to a suitable light source and developed, a color change is made. In some embodiments, the photosensitizer-coating unit 140 may firstly coat a resin coating on the outer surface of the layer object 22, and then coat the photosensitizer on the resin to form first photosensitizer-coating film 24; in other words, the first photosensitizer film 24 at least includes the resin coating on the outer surface of the layer object 22 and the photosensitizer adhered to the resin.

Figure 2C:
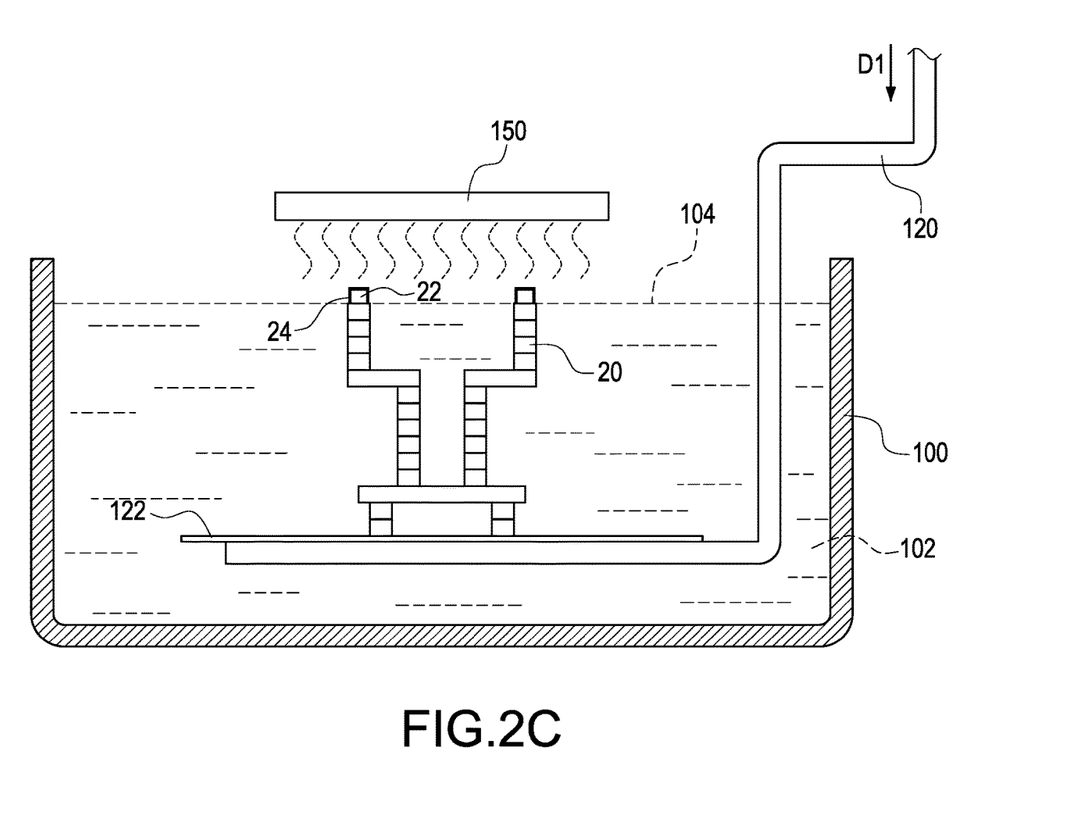

After forming the first photosensitizer film 24 on the layer object 22, the three-dimensional printing apparatus 10 may further dry the first photosensitizer film 24 by the drying unit 150 (as shown in FIG. 2C) if desire. After drying the first photosensitizer film 24, the controlling unit 110 makes an upper surface of the first photosensitizer film 24 be within the tank 100 to a certain depth from the liquid surface 104 as the three-dimensional object 30 only includes single color. The lighting module 130 irradiates the liquid forming material 102 for solidifying the liquid forming material 102 to another layer object 22, and another first photosensitizer film 24 flows over the layer object 22 accordingly. These procedures (as shown in FIG. 2A to FIG. 2C) are repeated until finally the three-dimensional object 30 is completely formed. Notably, drying the first photosensitizer film 24 may be beneficial for keeping the first photosensitizer film 24 formed the layer object 22 from leaving the layer object 22 as the first photosensitizer film 24 immerses in the liquid forming material 102.

Figure 2D:
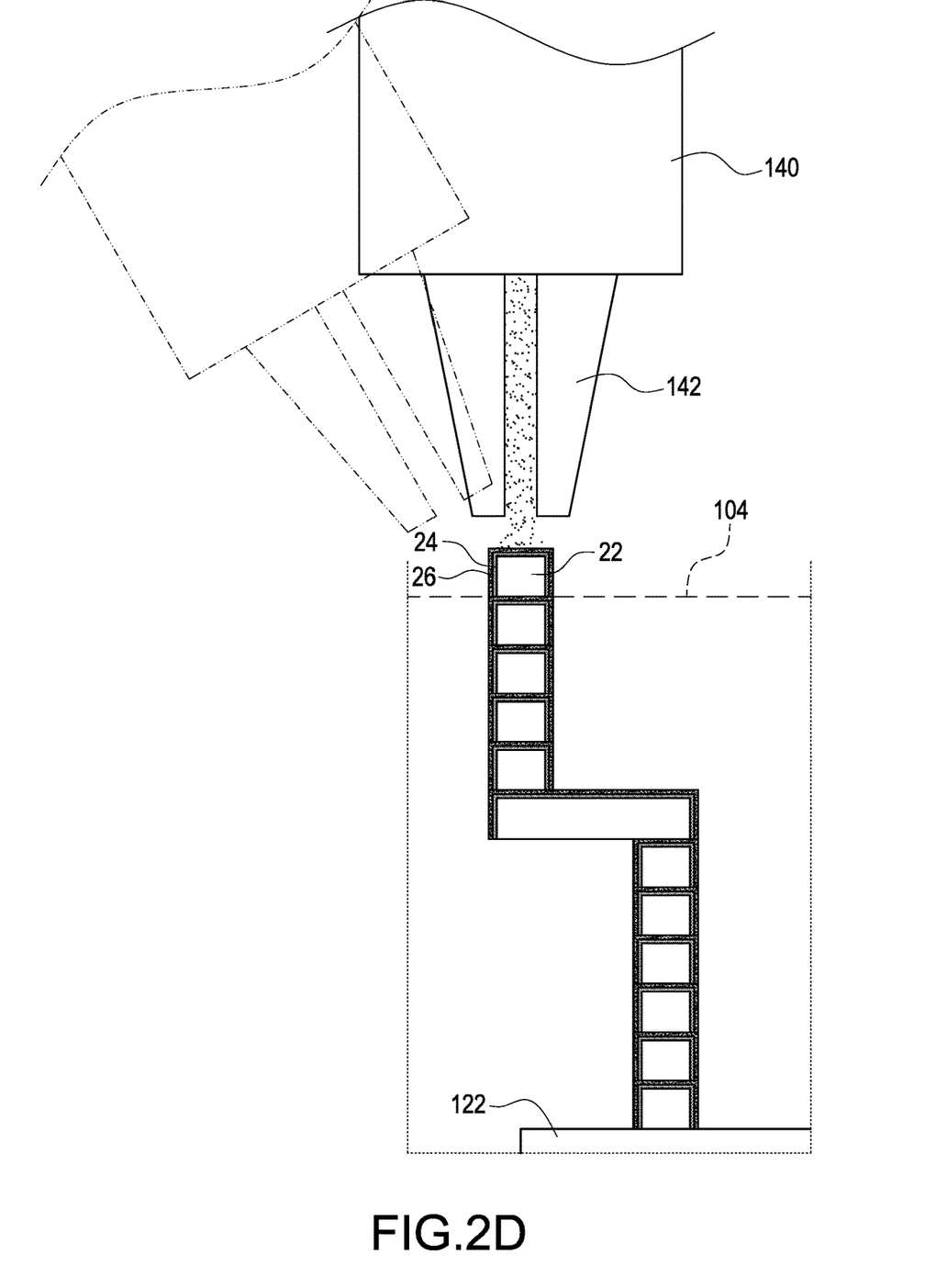

When the three-dimensional object 20 includes multi-colors, the three-dimensional printing apparatus 10 may include another photosensitizer-coating unit 140 for forming a second photosensitizer film 26 over the first photosensitizer film 24, as shown in FIG. 2D; wherein the second photosensitizer film 26 may partially or fully cover the first photosensitizer film 24. Notably, drying the first photosensitizer film 24 may be beneficial for keeping the first photosensitizer film 24 from being soluble in or mixing with the second photosensitizer film 26 that resulted in the occurrence of irregular color.

The first photosensitizer film 24 and the second photosensitizer film 26 are sensitive to irradiations with different wavelengths, and a result of a photochemical reaction occurring on exposure the first photosensitizer film 24 and the second photosensitizer film 26 to activating irradiations. Notably, the wavelength of the irradiations for activating the first photosensitizer film 24 and the second photosensitizer film 26 are different from that for solidifying the liquid forming material 102. After forming the second photosensitizer film 26 on the layer object 22, the three-dimensional printing apparatus 10 may further dry the second photosensitizer film 26 by the drying unit 150 as shown in FIG. 2C if desire. The three-dimensional printing apparatus 10 may further form a third photosensitizer film (not shown) on the second photosensitizer film 26 in a similar manner as described in conjunction with FIG. 2B and FIG. 2D for enhancing the color diversity of the three-dimensional object 20.

Figure 2E:
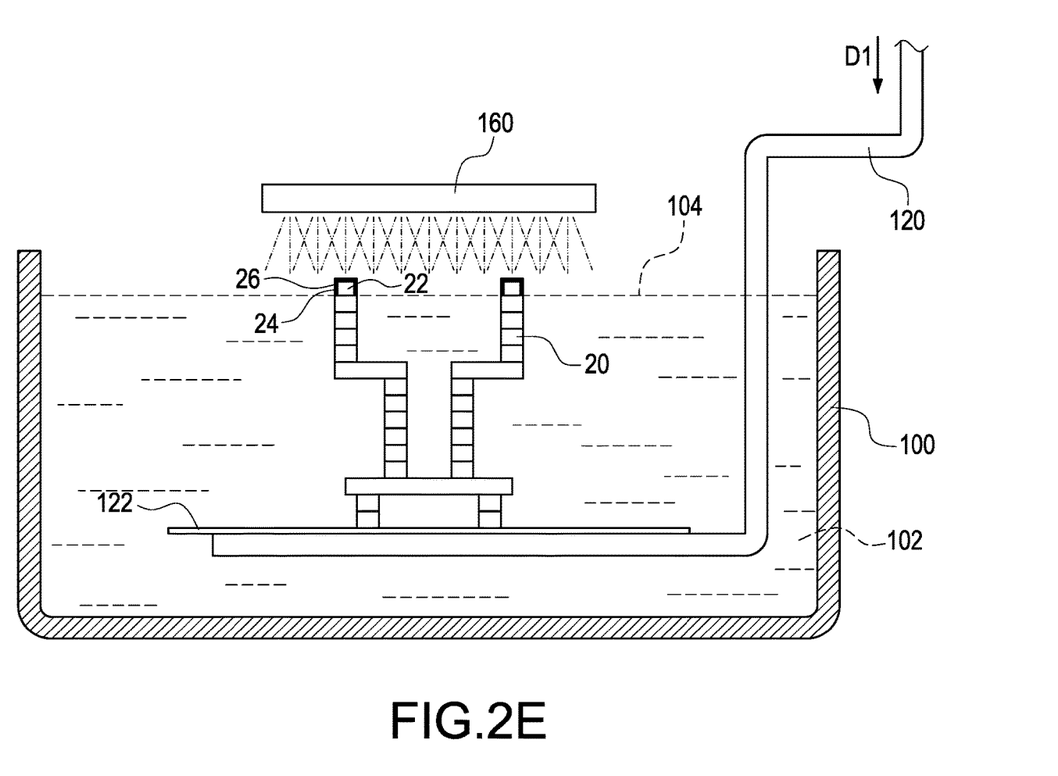

An exposing process, as shown in FIG. 2E, is performed after forming one or both of the first photosensitizer film 24 and the second photosensitizer film 26 on each layer objects 22. In the practical applications, however, the exposing process may be performed after the three-dimensional object 20 is completely formed. More particularly, after forming the first photosensitizer film 24 (or the second photosensitizer film 26) on the layer object 22, the controlling unit 110 makes an upper surface of the first photosensitizer film 24 (or the second photosensitizer film 26) be within the tank 100 to a certain depth from the liquid surface 104, and the lighting module 130 irradiates the liquid forming material 102 for solidifying the liquid forming material 102 to another layer object 22, and one or both of the first photosensitizer film 24 and the second photosensitizer film 26 flow over the layer object 22 accordingly; these procedures (as shown in FIG. 2A to FIG. 2D) are repeated until finally the three-dimensional object [[3]]20 is formed and the exposing process is performed thereafter. After that, the three-dimensional object 20 is dipped in a developer for coloration.

Figure 3:
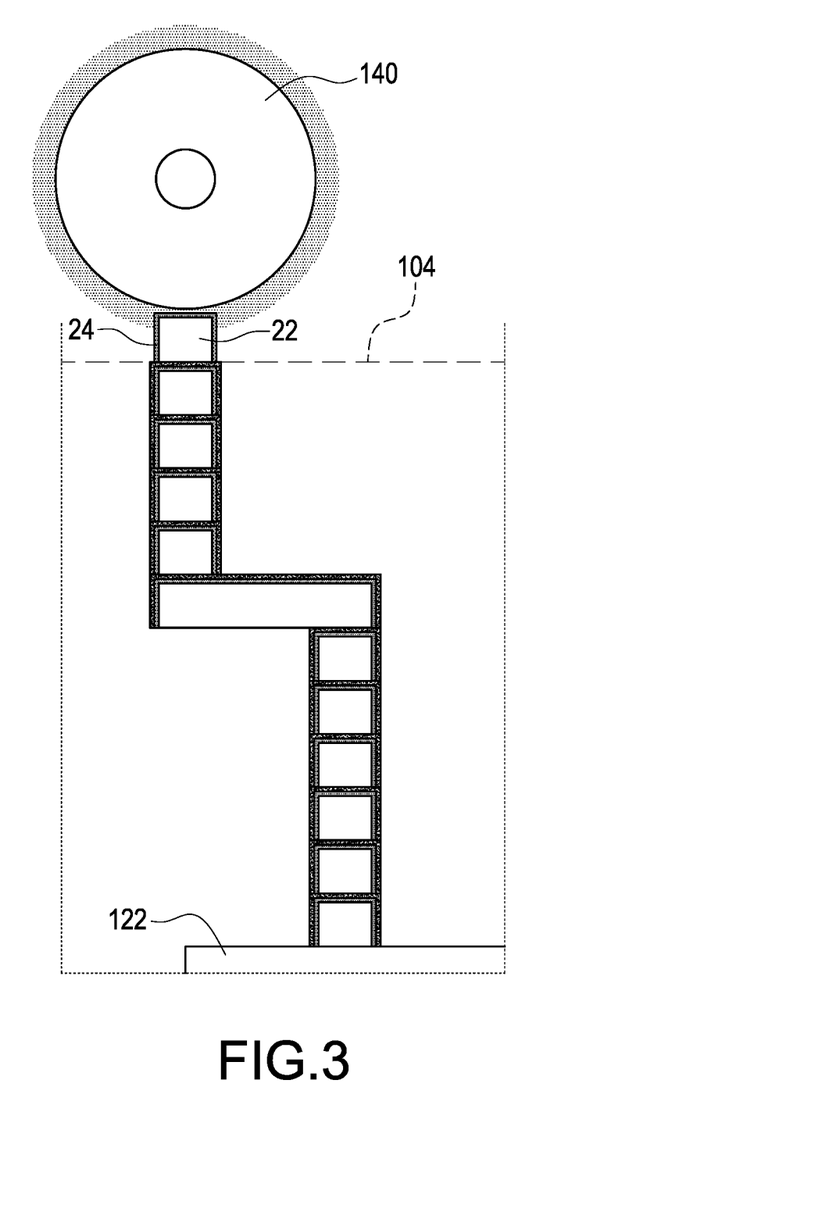
FIG. 3 is a schematic view illustrating intermediate process steps of a method for fabricating a three-dimensional object according to a second embodiment of the present disclosure.

One of or both of the first photosensitizer film 24 and the second photosensitizer film 26 may be formed on the layer object 22 by a coated roller, as shown in FIG. 3. The coated roller is adhered with the photosensitive resin, and the photosensitive resin is then transferred onto the layer object 22 to from the first photosensitizer film 24 or the second photosensitizer film 26 when the coated roller rotated on the layer object 22. Thereafter, the drying unit 150 shown in FIG. 3 may be configured to dry the first photosensitizer film 24 (and the second photosensitizer film 26).

Reference is made to FIGS. 4A-4D, which are schematic views illustrating intermediate process steps of a method for fabricating a three-dimensional object according to a third embodiment of the present disclosure. The method for fabricating the three-dimensional object may be the three-dimensional printing apparatus 10 including the control unit 110, the platform 120, the lighting module 130, the photosensitizer-coating unit 140, the drying unit 150, and the exposure and development unit 160 shown in FIG. 1. The platform 120 is disposed above the tank 100 and is adapted to move relative to the tank 100 along the first direction D1. The tank 100 contains the liquid forming material 102; the liquid forming material 102 is, for example, a photosensitive resin and may be sensitive to light with specific wavelength (such as ultraviolet light).

Figure 4A:
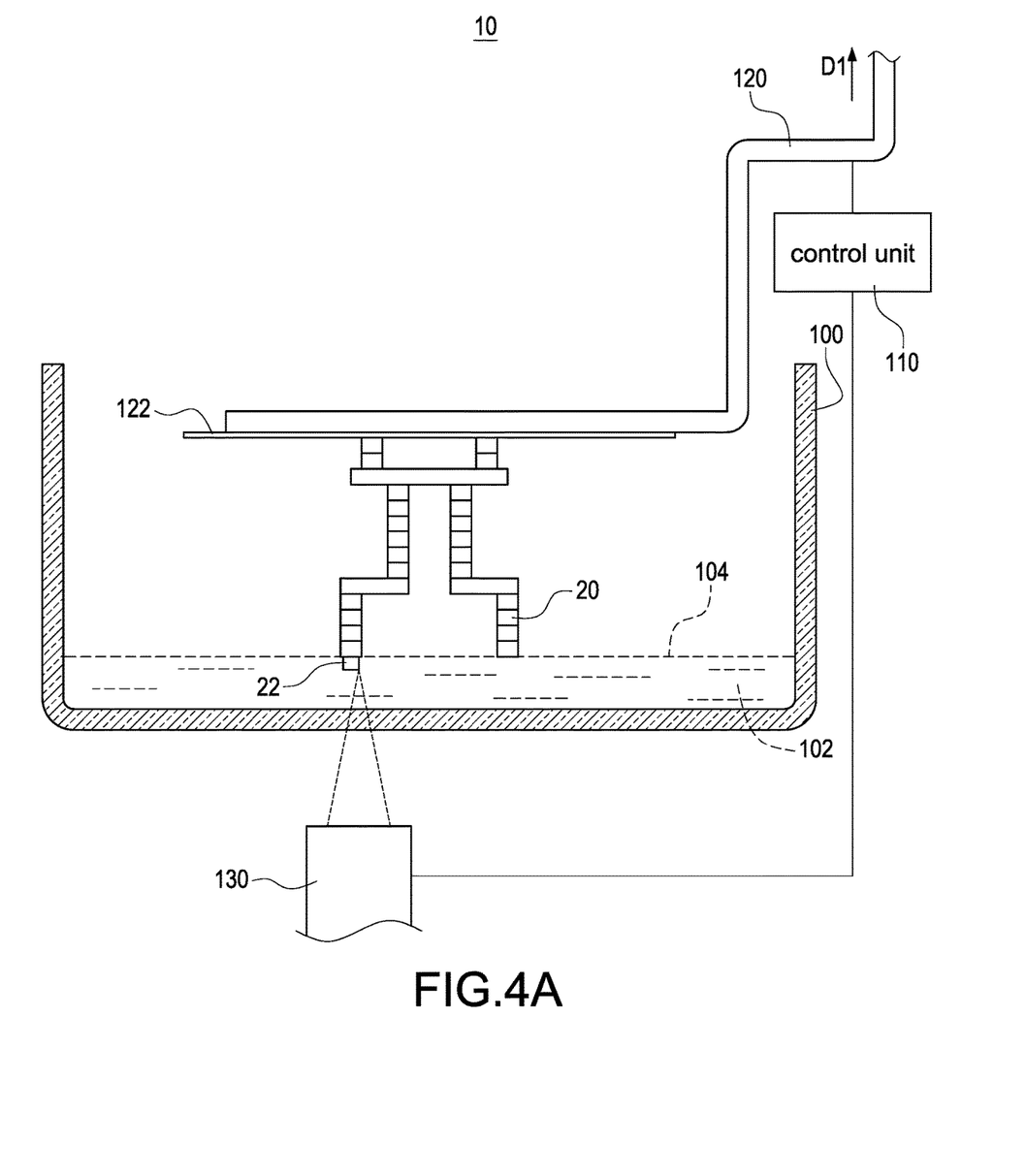
FIG. 4A-FIG. 4C are schematic views illustrating intermediate process steps of a method for fabricating a three-dimensional object according to a third embodiment of the present disclosure.

The lighting module 130 is movable disposed below the tank 100 and irradiates the liquid forming material 102 for solidifying the liquid forming material 102 to a certain depth from the bottom of the tank 100 to a base 122 of the platform 120. Thus, a layer object 22 of the three-dimensional object 20 is formed.

Figure 4B:
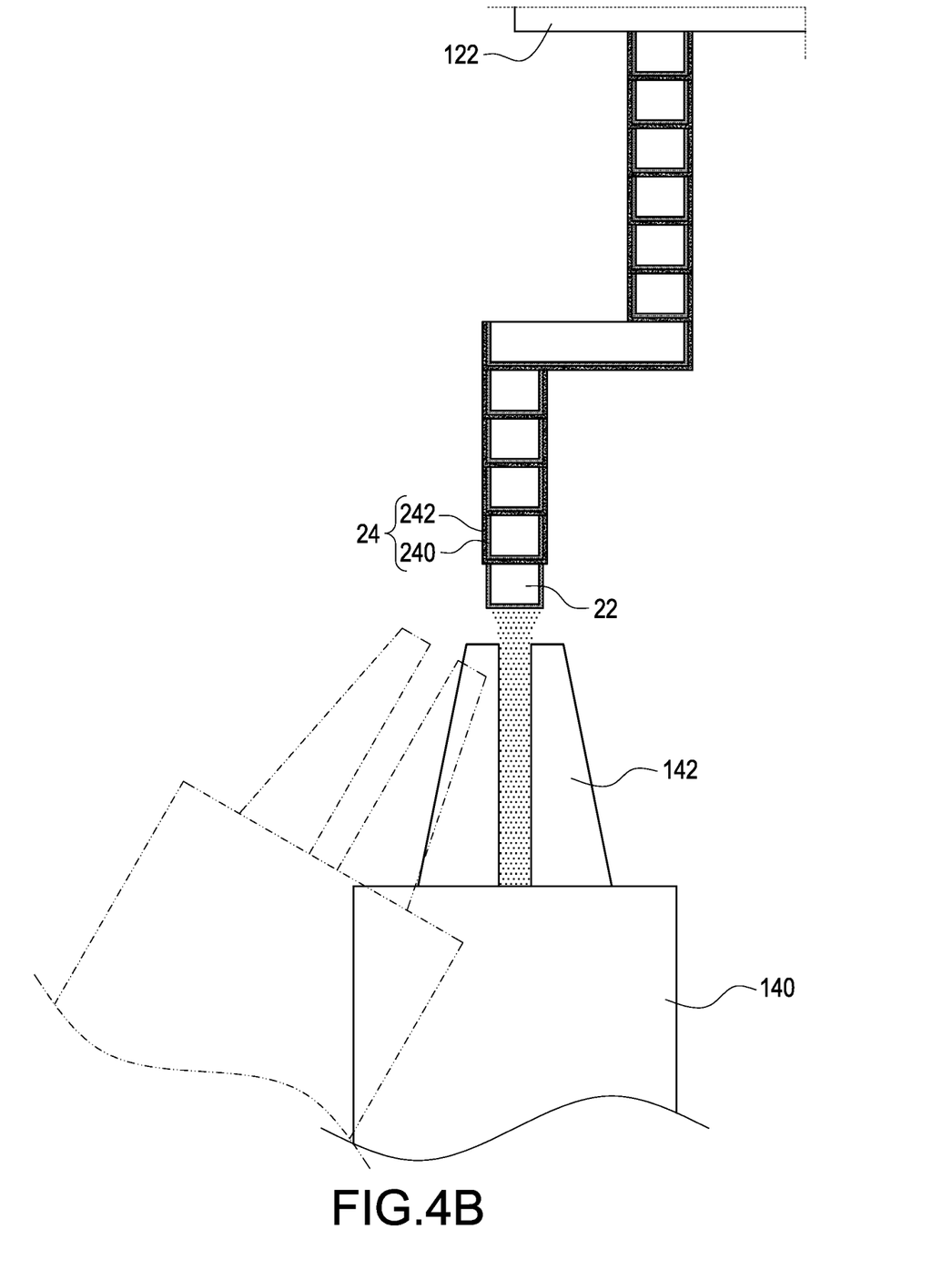

As shown in FIG. 4B, a first photosensitizer film 24 flows over the layer object 22 after the layer object 22 is formed. More particular, when the layer object 22 with desired pattern is formed at the liquid surface 104, the layer object 22 is held on the platform 120 and is lowered into the liquid forming material 102, at which condition, the platform 120 is directed to remove the layer object 22 from the liquid forming material 102. The photosensitizer-coating unit 140 includes an elongated nozzle 142 for supplying a photosensitive resin to the layer object 22 for forming the first photosensitizer film 24 of a substantially constant thickness on the outer surface of the layer object 22.

In some embodiments, the photosensitizer-coating unit 140 may firstly coat a resin material 240 (such as gelatin) on the outer surface of the layer object 22, and then coat the photosensitizer 242 on the resin material 240 to form the first photosensitizer film 24; in the other words, the first photosensitizer film 24 at least includes the resin material 240 on the outer surface of the layer object 22 and the photosensitizer 242 adhered to the resin material 240. An exposing process, as shown in FIG. 4C, is performed after forming the first photosensitizer film 24 on each layer objects 22.

Figure 4C:
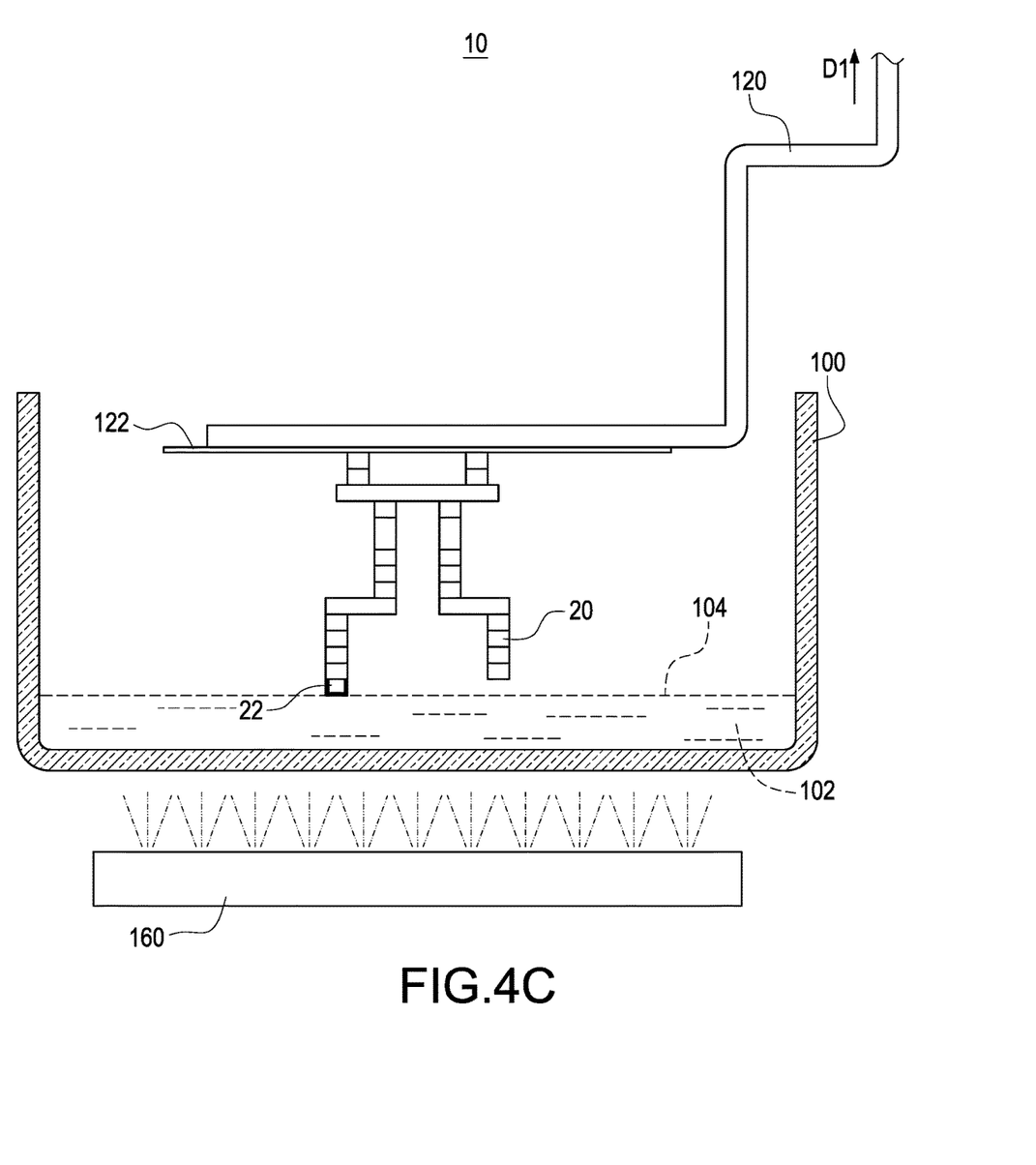

Thereafter, the controlling unit 110 makes partial layer object 22 coated with the first photosensitizer film 24 be within the tank 100 to a certain depth from the bottom 102 of the tank 100, and the lighting module 130 irradiates the liquid forming material 102 for solidifying the liquid forming material 102 to another layer object 22 (as shown in FIG. 4B)), and another first photosensitizer film 24 flows over the layer object 22 (as shown in FIG. 4C) accordingly.

These procedures (as shown in FIG. 4A to FIG. 4C) are repeated until finally the three-dimensional object 30 is completely formed. After that, the three-dimensional object 20 is dipped in a developer for coloration.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the disclosure as defined in the appended claims.

What is claimed is:

1. A three-dimensional printing apparatus, comprising:
a tank filled with a liquid material;
a platform movably disposed above the tank;
a lighting module used for projecting light towards the liquid material;
a control unit coupled to the platform and the lighting module and configured to control the platform to move along a direction, such that at least one layer object of a three-dimensional object is cured on the platform by the lighting module;
   wherein the at least one layer object is a structural layer used to define the shape of the three-dimensional object
a photosensitizer coating unit coupled to the control unit and configured to form at least one_photosensitizer films on the layer object, wherein the photosensitizer film comprises a resin material and a photosensitizer;
an exposure unit coupled to the control unit and configured to expose the photosensitizer for a color change so as to enhance the color diversity of the three-dimensional object; and
a drying unit electrically connected to the control unit and configured to dry the photosensitizer film top down for keeping the photosensitizer film formed on the layer object from leaving the layer object as the photosensitizer film is immersed in the liquid material;
   wherein the photosensitizer coating unit is configured to form a second photosensitizer film after the photosensitizer of a first photosensitizer film has been exposed and executed a drying program by the drying unit, so as to stack multiple layers of the photosensitizer film on the at least one layer objects to enhance color diversity;

wherein after the first photosensitizer film and second photosensitizer film are formed on the at least one layer object, the second photosensitizer film is exposed and dried, then the three dimensional object is lowered into the tank with the platform, a second layer object is formed on top of at least a portion of multiple layers of the photosensitizer film, and then a second forming of the first and second photosensitizer film is formed on the second layer object.

2. The three-dimensional printing apparatus of claim 1, wherein the exposure unit performs exposure on the photosensitizer while the layer object is formed.

3. The three-dimensional printing apparatus of claim 1, wherein the exposure unit performs exposure on the photosensitizer after the three-dimensional object is formed.

4. The three-dimensional printing apparatus of claim 1, wherein the platform is directed to remove the layer object from the liquid material along the direction by the control unit after the layer object is cured.

5. The three-dimensional printing apparatus of claim 1, wherein the photosensitizer is uniformly disposed within the resin material.

6. The three-dimensional printing apparatus of claim 1, wherein the photosensitizer is coated on the resin material.

7. The three-dimensional printing apparatus of claim 1, wherein the photosensitizer coating unit utilizes a nozzle or a roller.

8. The three-dimensional printing apparatus of claim 1, wherein the photosensitizer is silver halides.

9. A method of forming a three-dimensional object by a three-dimensional printing apparatus, wherein the three-dimensional printing apparatus includes a tank filled with a liquid material and a platform, the method comprising:
arranging a lighting module for irradiating the liquid material;
moving the platform for forming at least one layer object of the three-dimensional object with certain depth;
wherein the at least one layer object is a structural layer used to define the shape of the three-dimensional object;
forming at least one photosensitizer film over the layer object, wherein the photosensitizer film is an emulsion including a resin material and a photosensitizer;
exposing the photosensitizer for a color change to enhance the color diversity of the layer object;
forming the three-dimensional object by sequentially stacking layer objects with photosensitizer films;
drying the photosensitizer films before performing exposure for keeping the photosensitizer films formed on the layer object from leaving the layer object as the photosensitizer films are immersed in the liquid material;
forming a second photosensitizer film after the photosensitizer of a first photosensitizer film has been exposed and executed a drying program by the drying unit, so as to stack multiple layers of the photosensitizer film on the at least one layer objects to enhance color diversity;
wherein after the first photosensitizer film and second photosensitizer film are formed on the at least one layer object, the second photosensitizer film is exposed and dried, then the three dimensional object is lowered into the tank with the platform, a second layer object is formed on top of at least a portion of multiple layers of the photosensitizer film, and then a second forming of the first and second photosensitizer film is formed on the second layer object.

10. The method of claim 9, further comprising:
directing the platform to remove the layer object from the liquid material before forming the photosensitizer films.

11. The method of claim 9, wherein the photosensitizer film is exposed after the three-dimensional object is formed by sequentially stacking layer objects with the photosensitizer films.

12. The method of claim 9, wherein the photosensitizer is silver halides.

* * * * *